United States Patent
Welser et al.

(10) Patent No.: US 11,177,400 B1
(45) Date of Patent: Nov. 16, 2021

(54) CONCENTRATOR PHOTOVOLTAIC SUBASSEMBLY AND METHOD OF CONSTRUCTING THE SAME

(71) Applicant: Magnolia Optical Technologies, Inc., Woburn, MA (US)

(72) Inventors: Roger E. Welser, Providence, RI (US); Ashok K. Sood, Brookline, MA (US)

(73) Assignee: Magnolia Optical Technologies, Inc., Woburn, MA (US)

( * ) Notice: Subject to any disclaimer, the term of this patent is extended or adjusted under 35 U.S.C. 154(b) by 0 days.

(21) Appl. No.: 15/708,057

(22) Filed: Sep. 18, 2017

Related U.S. Application Data

(62) Division of application No. 12/985,921, filed on Jan. 6, 2011, now abandoned.

(60) Provisional application No. 61/293,469, filed on Jan. 8, 2010.

(51) Int. Cl.
| H01L 31/00 | (2006.01) |
| H01L 31/0232 | (2014.01) |
| H01L 31/054 | (2014.01) |

(52) U.S. Cl.
CPC ...... *H01L 31/0232* (2013.01); *H01L 31/0543* (2014.12); *H01L 31/0547* (2014.12); *Y02E 10/50* (2013.01)

(58) Field of Classification Search
CPC ............. H01L 31/0232; H01L 31/0543; H01L 31/0547; Y02E 10/50
See application file for complete search history.

(56) References Cited

U.S. PATENT DOCUMENTS

| 2,668,867 | A | 2/1954 | Ekstein |
| 3,368,078 | A | 2/1968 | Flint et al. |
| 4,964,713 | A | 10/1990 | Goetzberger |
| 2006/0076047 | A1* | 4/2006 | Green ................ B29C 39/10 136/243 |
| 2007/0002963 | A1 | 2/2007 | Kanemaru et al. |
| 2008/0060696 | A1 | 3/2008 | Ho et al. |
| 2008/0121269 | A1 | 5/2008 | Welser et al. |
| 2008/0276990 | A1 | 11/2008 | Zhou et al. |
| 2009/0014056 | A1 | 1/2009 | Hockaday |
| 2009/0211632 | A1* | 8/2009 | Brett ................ C23C 14/226 136/256 |

(Continued)

OTHER PUBLICATIONS

Tundo et al., "A Structural Study of InGaAs/InGaAs Strain-Balanced MQW for TPV Applications", AIP Conference Proceedings 653, 201 (2003), pp. 201-209. (Year: 2003).*

(Continued)

*Primary Examiner* — Thanh Truc Trinh
(74) *Attorney, Agent, or Firm* — Loginov & Associates, PLLC; William A. Loginov

(57) ABSTRACT

Refractive optical element designs are provided for high geometric optical efficiency over a wide range of incident angles. To minimize Fresnel reflection losses, the refractive optical element designs employ multiple encapsulant materials, differing in refractive index. Concentrator photovoltaic subassemblies are formed by embedding a high efficiency photovoltaic device within the refractive optical element, along with appropriate electrical contacts and heat sinks. Increased solar electric power output is obtained by employing a single-junction III-V material structure with light-trapping structures.

6 Claims, 7 Drawing Sheets

(56) References Cited

U.S. PATENT DOCUMENTS

2010/0065120 A1* 3/2010 McDonald ........ H01L 31/02168
  136/259
2010/0116327 A1* 5/2010 Cornfeld .......... H01L 31/06875
  136/255
2010/0175750 A1 7/2010 Gambino et al.

OTHER PUBLICATIONS

Alemu et al., "Dependence of Device Performance on Carrier Escape Sequence in Multi-Quantum-Well p-i-n Solar Cells", May 2006, pp. 084506-1-084506-5, vol. 99, No. 084506, Publisher: Journal of Applied Physics.

Okada et al., "Fabrication of Potentially Modulated Multi-Quantum Well Solar Cells", Dec. 2005, pp. 591-594, Publisher: Proceedings of the 31st IEEE Photovoltaic Specialist Conference.

Mont et al., "High-Refractice Index TiO2-Nanoparticle-Loaded Encapsulants for Light Emitting Diodes", Apr. 2008, pp. 083120-1-083120-6, vol. 103, No. 083120, Publisher: Journal of Applied Physics.

\* cited by examiner

CONCENTRATOR PHOTOVOLTAIC SUBASSEMBLY AND METHOD OF CONSTRUCTING THE SAME

RELATED APPLICATIONS

This application is a divisional of co-pending U.S. patent application Ser. No. 12/985,921, filed Jan. 6, 2011, entitled CONCENTRATOR PHOTOVOLTAIC SUBASSEMBLY AND METHOD OF CONSTRUCTING THE SAME, which application claims the benefit of U.S. Provisional Patent Application No. 61/293,469, filed on Jan. 8, 2010, entitled EFFICIENT SOLAR CELL EMPLOYING MULTIPLE ENERGY-GAP LAYERS AND LIGHT-SCATTERING STRUCTURES AND METHODS FOR CONSTRUCTING THE SAME, the entire discloses of each of which applications are expressly incorporated herein by reference.

GOVERNMENT SUPPORT

This invention was supported in part by Small Business Technology Transfer (STTR) program award #IIP-0939343 from the National Science Foundation (NSF) to Magnolia Optical Technologies, Inc., 52 B Cummings Park, Suite 314, Woburn, Mass. 01801. The government may have certain rights in this invention.

FIELD OF THE INVENTION

This invention relates to semiconductor-based photovoltaic energy converters, also known as "solar cells;" and to concentrator photovoltaic systems and subassemblies; and to the design and fabrication of the same.

BACKGROUND OF THE INVENTION

Photovoltaic (PV) technologies that convert sunlight directly into electricity hold great promise as a sustainable, environmentally friendly energy source for the 21$^{st}$ century. In particular, concentrator photovoltaic (CPV) technologies promise to achieve widespread deployment in renewable energy systems by combining high performance with low costs. By trading expensive PV semiconductor materials for cheaper plastic lenses and/or metal mirrors, CPV systems can in principle improve performance and reduce overall photovoltaic module costs. While a variety of different approaches to CPV design are being pursued, all CPV systems suffer from a fundamental trade-off between field-of-view and concentration ratio. Thermodynamic limits dictate that the maximum concentration ratio depends upon the half-acceptance angle ($\pm\theta_a$) and the refractive index (n) of the concentrator material that encapsulates the PV cell. That is, the maximum geometric concentration ($C_{max}$) is given by the following equation.

$$C_{max} = \frac{n^2}{\sin^2\theta_a} \quad [1]$$

Equation [1] highlights the importance of increasing the refractive index of the contractor material in order to maximize the concentration ratio of CPV systems. For example, since the concentration follows an n$^2$-dependency, the concentration ratio can increase 4 times when the refractive index of the concentrator material is changed from 1 to 2.

Therefore, it is desirable to provide CPV subassemblies comprised of refractive optical elements that employ high-refractive-index material to increase concentration ratios of CPV systems while maintaining a wide field-of-view. It is also desirable to provide CPV cell designs that maximize power output over a wide range of environmental conditions and spectral inputs.

SUMMARY OF THE INVENTION

This invention overcomes the disadvantages of the prior art by employing high index of refraction encapsulants to construct a refractive optical element with high optical collection efficiency over a wide range of incident angles and minimal reflection losses. When combined with a novel photovoltaic solar cell device structure, this invention can deliver unprecedented levels of electrical energy per unit area, and employs light emitting diode (LED) device fabrication and packaging methods to minimize manufacturing costs.

In an illustrative embodiment, a concentrating photovoltaic cell subassembly comprises a semiconductor photovoltaic solar cell with electrical leads, embedded within a step-graded encapsulant lamp, defining a refractive optical element comprised of encapsulant materials with at least two different refractive indices, such that the refractive index varies in steps between the refractive index of air and the refractive index of the semiconductor photovoltaic solar cell.

In another illustrative embodiment, a concentrating photovoltaic device or subassembly comprises at least one transparent encapsulant material that encases: a III-V semiconductor solar cell material structure with at least one layer of narrow energy gap material embedded within a wider energy gap material matrix; a bottom reflective contact structure consisting of a metal layer and an optical coating of at least one layer sandwiched between the back side of the semiconductor solar cell material structure and the metal layer; a top antireflection structure comprising an optical coating of at least one layer, such that the refractive index of each layer in the optical coating is intermediate between the semiconductor solar cell material structure and the overlying encapsulant material; and a lead frame upon which the semiconductor solar cell material structure, coatings and contact structures is placed, and which provides electrical contact to the solar cell device and a pathway for heat extraction.

In another illustrative embodiment, a method of constructing the improved a concentrating photovoltaic cell subassembly comprises: synthesizing a semiconductor solar cell material structure; coating the semiconductor solar cell material structure with optical films and forming top and bottom electrical contacts; dicing the semiconductor solar cell material structure into individual die, bonding the solar cell die to a supporting lead frame, and wire bonding electrical leads to the solar cell die; and embedding the lead frame with the attached solar cell die within a transparent encapsulant by placing attached die into a mold filled with a liquid encapsulant, curing the encapsulant, and separating from the mold.

BRIEF DESCRIPTION OF THE DRAWINGS

The invention will be readily understood by the following detailed description in conjunction with the accompanying drawings, wherein like reference numerals designate like structural elements, and in which.

The drawings are not necessarily to scale with emphasis instead being placed upon illustrating embodiments of the present invention.

DETAILED DESCRIPTION

Embodiments of the invention are discussed below with reference to FIGS. 1-5. Those skilled in the art will readily appreciate that the detailed description given herein with respect to these figures is for explanatory purposes, however, because the invention extends beyond these limited embodiments.

As dictated by the thermodynamic limits summarized in equation [1], the concentration of any concentrator photovoltaic (CPV) system is greatly improved by embedding PV solar cells within a transparent encapsulant with an index of refraction (n) greater than one. For example, the use of high refractive index encapsulant material with n=2 enables the realization of CPV systems of 5× concentration without significant loss in field of view ($\theta_a$>60°). In another example, concentrations approaching 10× can be realized with n=2 encapsulant material in fixed, stationary CPV systems which restrict the field of view in the north-south direction to less than 27°. In yet another example, concentrations exceeding 500× can be realized in one-axis CPV tracking systems which employ n=2 encapsulant material and restrict the field of view to approximately 2° in the north-south direction and approximately 12° in the east-west direction. In all of these examples, CPV systems can be constructed using CPV subassemblies comprising a solar cell device embedded within a refractive optical element. The CPV subassemblies are interconnected in a tiled pattern, or combined with additional refractive or reflective optics to form complete CPV systems. Examples of additional refractive or reflective optics include but are not limited to Fresnel lenses and metallic mirrors.

While CPV systems offer a number of advantages over non-concentrating PV systems, including reduced semiconductor material costs, enhanced open circuit voltage performance, and enhanced light trapping capabilities, concentration can also introduce unwanted optical losses. Even if very high transmittance encapsulants are employed, Fresnel reflection losses will arise due to the difference in refractive index between the encapsulant material and air. For example, if an n=2 encapsulant material is employed, reflection losses at the encapsulant-air interface can vary from over 11% at normal incidence to over 32% at approximately 60° incidence. Therefore it is highly desirable to provide optical designs that minimize reflection losses, such as the designs illustrated in FIGS. 1 and 2.

Figure 1:
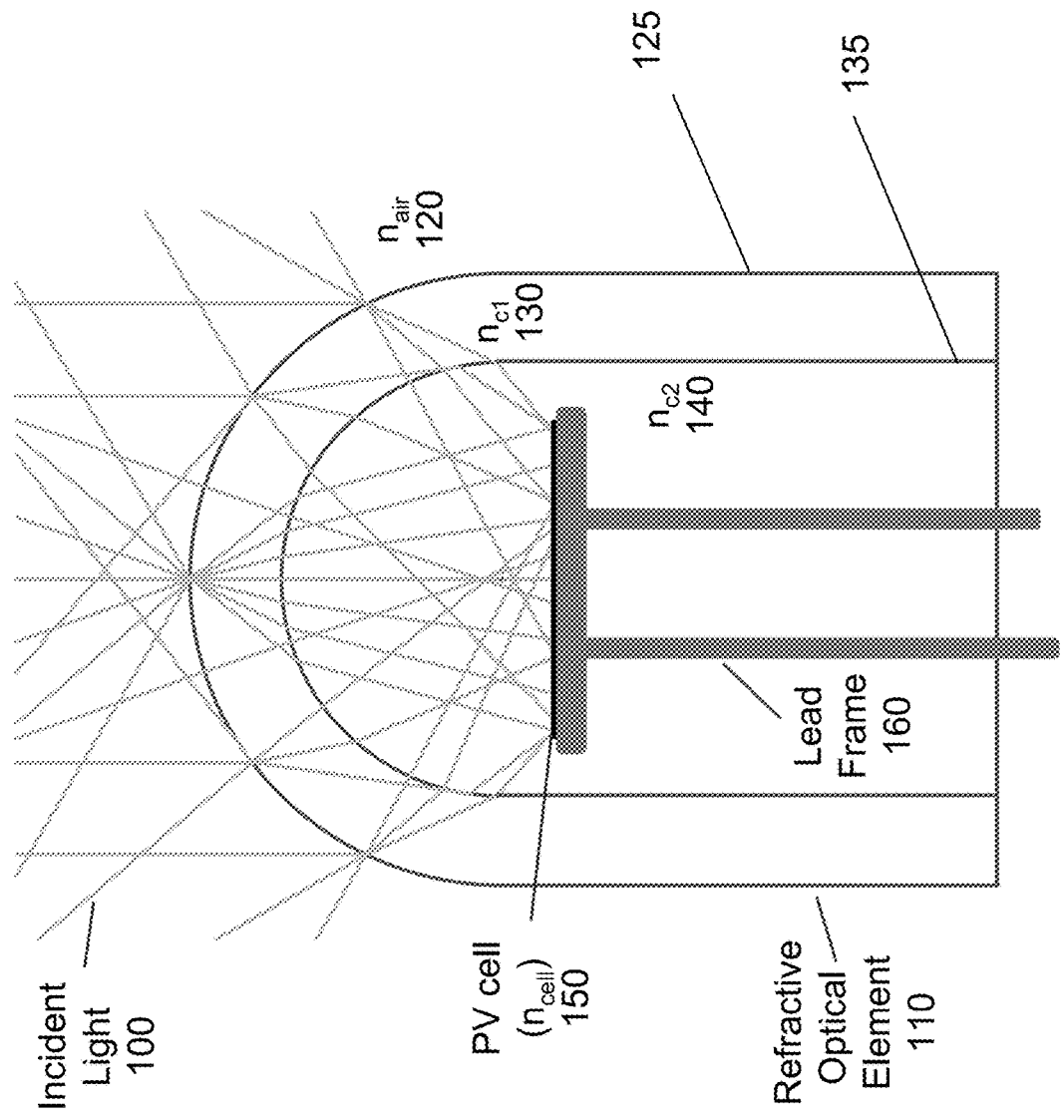
FIG. 1 is a cross-sectional schematic diagram of a concentrator photovoltaic cell subassembly comprising a PV cell mounted on a lead frame and encased within a dome-shaped refractive optical element comprised of two different index encapsulants, according to an illustrative embodiment.

FIG. 1 details a cross-sectional view of an illustrative embodiment of a CPV subassembly that can be fabricated using techniques that are commonly used to manufacture light emitting diodes (LEDs). A solar cell chip is mounted on a lead frame, which provides electrical contacts and heat sinking. The semiconductor solar cell chip and lead frame is then encased within a refractive optical element formed from transparent, moldable, encapsulant material. In FIG. 1, the refractive optical element is shown to comprise two concentric hemispherical lenses employing two different refractive index materials, such that the outer lens has a refractive index $n_{c1}$, and the inner lens has a refractive index $n_{c2}$. To reduce Fresnel reflection losses the encapsulant materials should have refractive indices intermediate between the refractive index of air ($n_{air}$) and the refractive index of the semiconductor solar cell ($n_{cell}$), such that:

$$n_{cell} > n_{c2} > n_{c1} > n_{air}.$$

In an illustrative embodiment that can minimize Fresnel reflection losses, $n_{c1}$ is equal to the square root of $n_{c2}$. In the illustrative embodiment depicted in FIG. 1, $n_{c1}$=1.41 and $n_{c2}$=2, while the PV cell is positioned approximately 1.17*R below the top of the outer lens, where R is the radius of the outmost hemispherical lens.

According to an illustrative embodiment, as shown in FIG. 1, in operation, incident light 100 strikes a refractive optical element 110 over a wide range of angles. The angles in this illustrative embodiment range from normal to approximately 60° from normal. The incident light 100 is then refracted at the interface 125 between air 120 and the first encapsulant material 130. In FIG. 1, the outermost $n_{air}$-$n_{c1}$ interface 125 defines a hemispherical dome of radius R. Incident light 100 is then refracted a second time at the interface 135 between the first encapsulant material 130 and the second encapsulant material 140. As shown in FIG. 1, the innermost $n_{c1}$-$n_{c2}$ interface 135 defines a hemispherical dome, concentric with the outermost dome and with a radius equal to R/$n_{c1}$. Incident light then strikes a PV cell 150 embedded within the second encapsulant material 140. The PV cell is operatively connected to a lead frame 160 or similar structure. The lead frame structure 160 and corresponding wire bonds and epoxy bonds (now shown) provide electrical contact from outside the refractive optical element to both the n-type and p-type contacts on the PV cell. The lead frame 160 or similar structure also provides a pathway for heat to flow away from the PV cell and out of the refractive optical element 110. The lead frame 160 can be any similar structure known to those of ordinary skill.

The refractive optical element depicted in FIG. 1 represents one of many possible designs encompassed by the teachings herein. For example, the geometric concentration can be readily adjusted by altering the size of the PV cell and its position within the refractive optical element. The shape of both lenses formed by the $n_{air}$-$n_{c1}$ and $n_{c1}$-$n_{c2}$ interfaces can also be engineered to tailor the light striking the PV cell, as will be apparent to those of ordinary skill.

Figure 2:
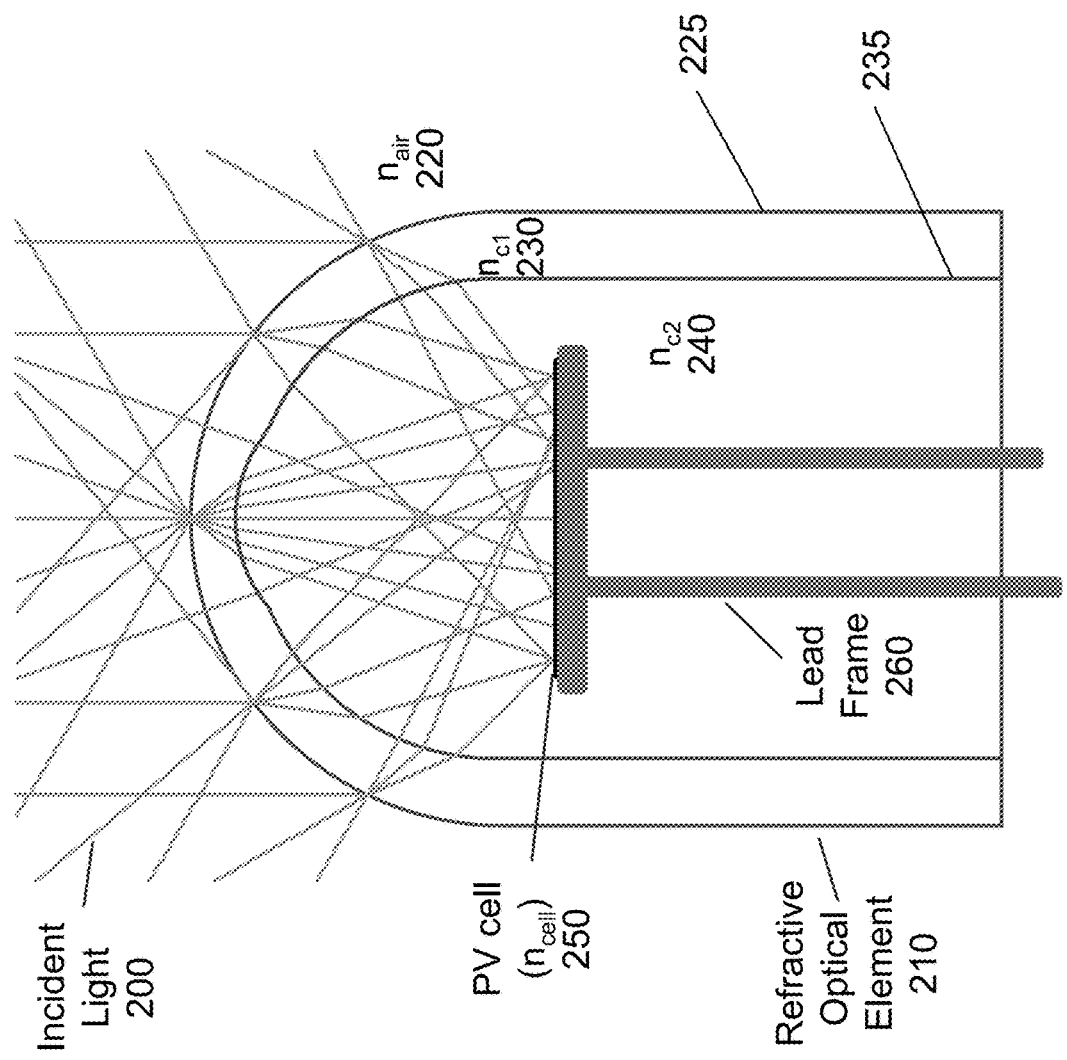
FIG. 2 is a cross-sectional schematic diagram of a concentrator photovoltaic cell subassembly comprising a PV cell mounted on a lead frame and encased within a dome-shaped refractive optical element comprised of two different index encapsulants, according to an illustrative embodiment.

According to another embodiment, as shown in FIG. 2 in operation, incident light 200 strikes a refractive optical element 210 over a wide range of angles. The angles in this illustrative embodiment range from normal to approximately 60° from normal. The incident light 200 is then refracted at the interface 225 between air 220 and the first encapsulant material 230. In FIG. 2, the outermost $n_{air}$-$n_{c1}$ interface 225 defines a hemispherical dome of radius R. Incident light 200 is then refracted a second time at the interface 235 between the first encapsulant material 230 and the second encapsulant material 240. In FIG. 2, the innermost $n_{c1}$-$n_{c2}$ interface 235 defines a hemispherical dome surface over the lower portions and an ellipsoidal surface over the topmost portions, both offset from the outermost dome. Incident light then strikes a PV cell 250 embedded within the second encapsulant material 240. The PV cell is operatively connected to a lead frame 260 or similar structure. The structure 260 can be any structure known to those of ordinary skill that provides electrical contact to the PV cell and a pathway for heat to flow away from the PV cell 250 and out of the refractive optical element 210.

Figure 3:
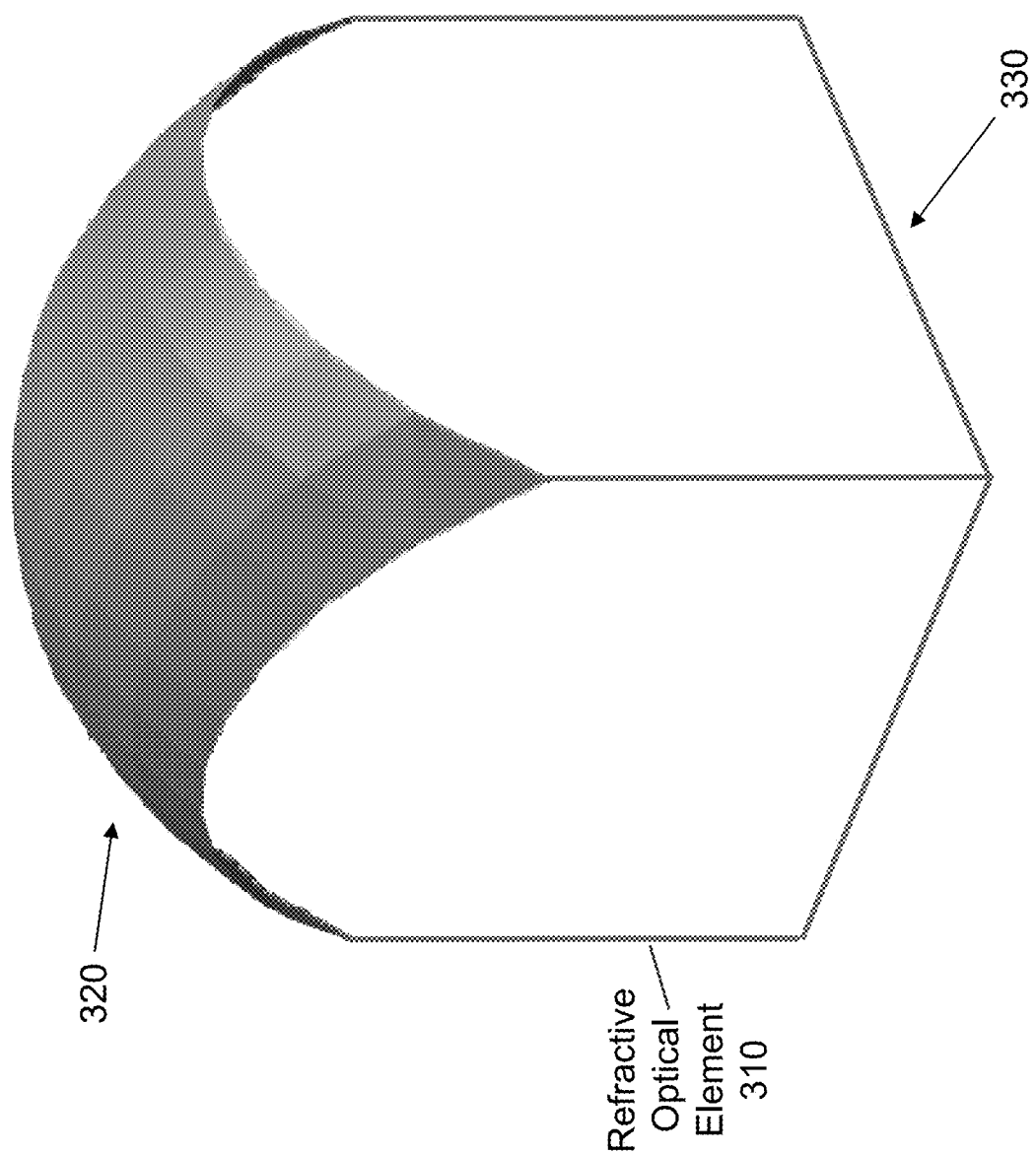
FIG. 3 is a three-dimensional perspective view of a dome-shaped refractive optical element, according to illustrative embodiments.

The diagrams shown in FIGS. 1 and 2 represent two-dimensional cross-sectional views of a PV subassembly. The teachings herein are also applicable to a wide variety of three-dimensional refractive optical element designs, according to illustrative embodiments. As an illustrative embodiment, refer to FIG. 3 which depicts a three-dimensional perspective view of a refractive optical element 310, showing a three-dimensional application similar to the two-dimensional cross section 110 and 210. As shown in FIG. 3, the top surface 320 of the refractive optical element defines a hemispherical dome, while the rest of the refractive optical element approximately defines a cube-shaped surface. In this embodiment, the bottom base 330 is square shaped however the shape of the bottom base can include any shape, including a square, rectangle, circle, and hexagon, among others readily apparent to those having ordinary skill.

The PV cell 150, 250 employed in the concentrating subassembly disclosed herein comprises any conventional semiconductor solar cell, including silicon cells and multi junction III-V cells for example. Multi junction III-V cells offer higher peak solar electric conversion efficiency than any silicon-based cell, and can be readily fabricated in a wide variety of chip dimensions, from several hundred microns to several centimeters. However, the current output of a multi junction cell is limited by the subcell generating the least amount of current. As a result, multi junction solar cells are sensitive to changes in the solar spectrum striking the cell, and will not necessarily generate the most electrical power over time, particularly depending upon the geographic location in which the CPV system is employed. In addition, multi junction cells require relatively thick epitaxial layers which significantly increase the material costs of the PV cell. Therefore, it is desirable to employ thin, single-junction III-V cells that can provide both high current and voltage output over a wide range of solar spectrums.

Figure 4:
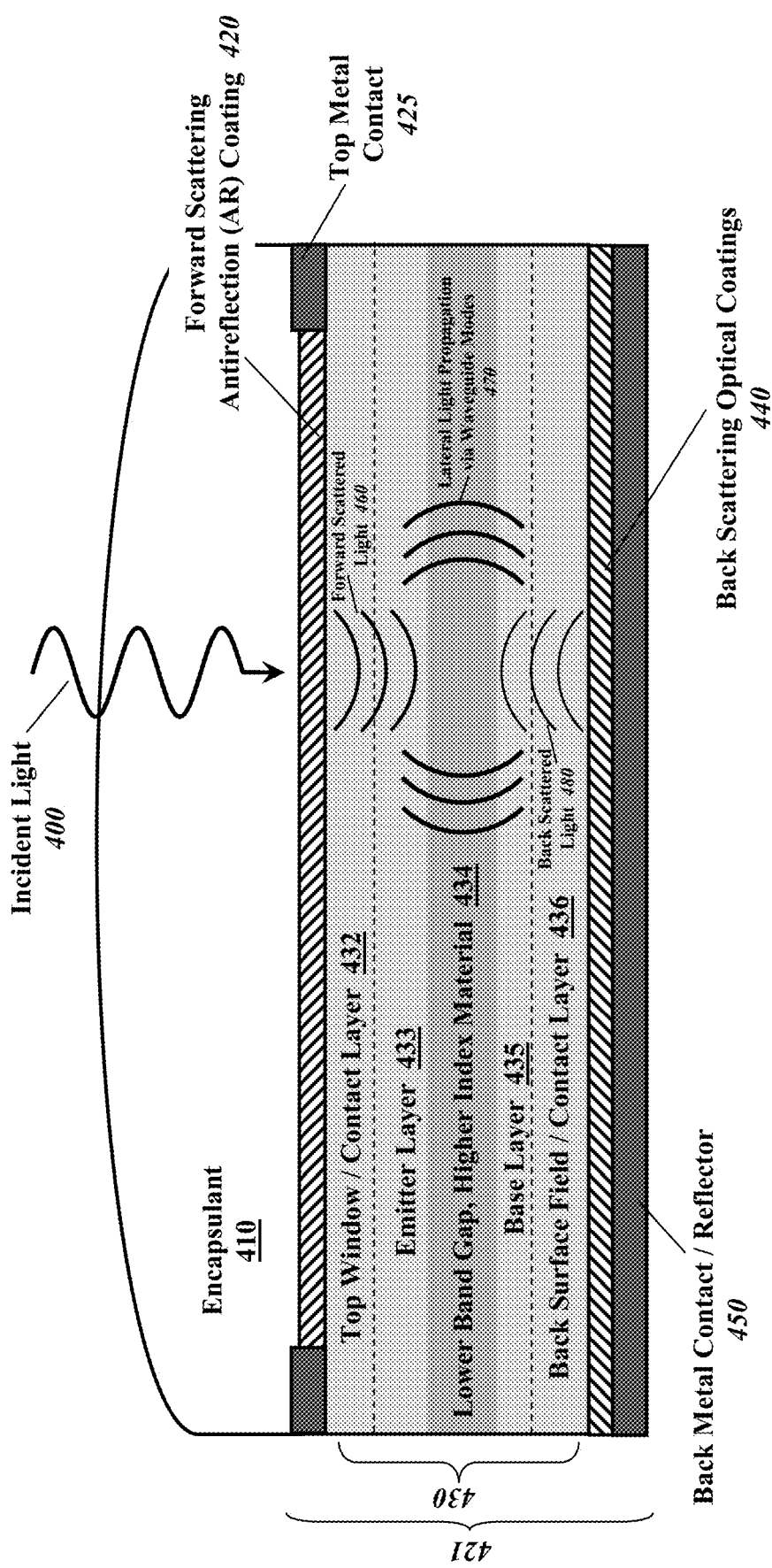
FIG. 4 is a schematic cross-sectional side view of a thin film solar cell device according to illustrative embodiments incorporating a lower band gap, higher refractive index absorption layer and optical coatings to increase the optical path length of incident light through the active region of the device.

FIG. 4 depicts a thin film waveguide photovoltaic device according to an illustrative embodiment. The photovoltaic device and other aspects of its construction are described in U.S. patent application Ser. No. 12/985,748, filed on Jan. 6, 2011, entitled QUANTUM WELL WAVEGUIDE SOLAR CELLS AND METHODS OF CONSTRUCTING THE SAME, which is expressly incorporated herein by reference for useful background information. As shown in FIG. 4, in operation, incident light 400 first encounters the encapsulant materials 410 of a refractive optical element. For example, the encapsulant materials can comprise those illustrated in FIGS. 1-3 as materials 130, 140 and 230, 240. Incident light 400 then strike a PV cell 421 comprised of a semiconductor PIN diode and accompanying optical coatings and metallic, electrical contact structures. The PV cell is illustrated in FIGS. 1 and 2 as PV cell 150 and 250, respectively. The embedded PIN diode semiconductor material device structure 430 depicted in FIG. 4 is coated on the top side with a transparent optical coating 420 that minimizes reflection losses and scatters incident light into the underlying PIN diode 430. The refractive index of the top optical coating 420 is illustratively adapted to generate a graded index of refraction antireflection coating, comprising one or more layers with refractive index intermediate between the innermost encapsulant material 410 and the PIN diode semiconductor material 430. In an illustrative embodiment one or more of the layers in the top optical coating 420 also incorporate nanoparticles or nanorods which differ in refractive index from that of their surrounding material.

In the illustrative embodiment shown in FIG. 4, the PIN diode device structure consists of top window/contact layers 432, emitter layer 433, base layer 435, back surface field/contact layers 136, and incorporates lower energy gap material 434 within the depletion region of the PIN diode structure 430. Lower energy gap material also typically has a higher index of refraction, thereby resulting in the formation of a waveguide structure. The lower energy gap material can consist of any common III-V semiconductor, including InGaAs, InAsSb, and InGaN for example. Electrical contact is made to the top window/contact layers 432 via metal contacts 425.

In the illustrative embodiment shown in FIG. 4, the back of the semiconductor PIN diode 430 is coated with a conductive, transparent optical coating 440. In an illustrative embodiment, the refractive index of the bottom optical coating 440 has a value of approximately 1.5 or lower, thereby creating an Omni-directional reflector when combined with the underlying metallic layer 450. In another illustrative embodiment, the bottom optical coating 440 consists of multiple layers differing in refractive index to form a distributed Bragg reflector. In yet another illustrative embodiment one or more of the layers in the bottom optical coating 440 also incorporate nanoparticles or nanorods. In yet another illustrative embodiment, the back scattering structure, consisting of the back optical coating 440 and back metal contact 450, employ plasmonic structures. Plasmonic structures closely coupled to absorbing semiconductors can be used to increase the photocurrent in a variety of thin film solar cells. In particular, the peak wavelength of the Plasmon resonance is adjustable to match the absorption band of the nearby semiconductor layers, particularly the lower band gap, higher index material 434.

In the illustrative embodiment shown in FIG. 4, optical scattering by the nanoparticles or nanorods above the semiconductor device structure can lead to coupling of photons incident normal to the device surface into lateral optical propagation paths, i.e., paths parallel to the device surface. These parallel optical modes 470 result from the introduction of a lateral wave vector component into the forward scattered wave 460, and can dramatically enhance the optical path length of photons through thin film solar cell device structures. Unabsorbed, lower energy photons that are not coupled into the waveguide modes 470 can then be back-scattered 480 into the active, absorbing layers of the device by the presence of the back scatting structure, which consists of the back optical coating 440 and back metal contact 450.

The operating voltage of a semiconductor PIN diode solar cell 430 is generally dictated by the underlying dark diode current of the device. The dark diode current of semiconductor devices is composed of several different components, all of which are dependent upon the energy gap of the material used in the active junction of the device. Typically, each cell in a solar cell consists of one type of material, and the energy gap of that material influences both the current and voltage output of the device. Lower energy gap material can enhance the current generating capability, but typically results in a lower operating voltage. Therefore, it is desirable to provide a device structure 430 that can harness the current generating capabilities of narrow energy gap material while also maintaining a high operating voltage.

Figure 5:
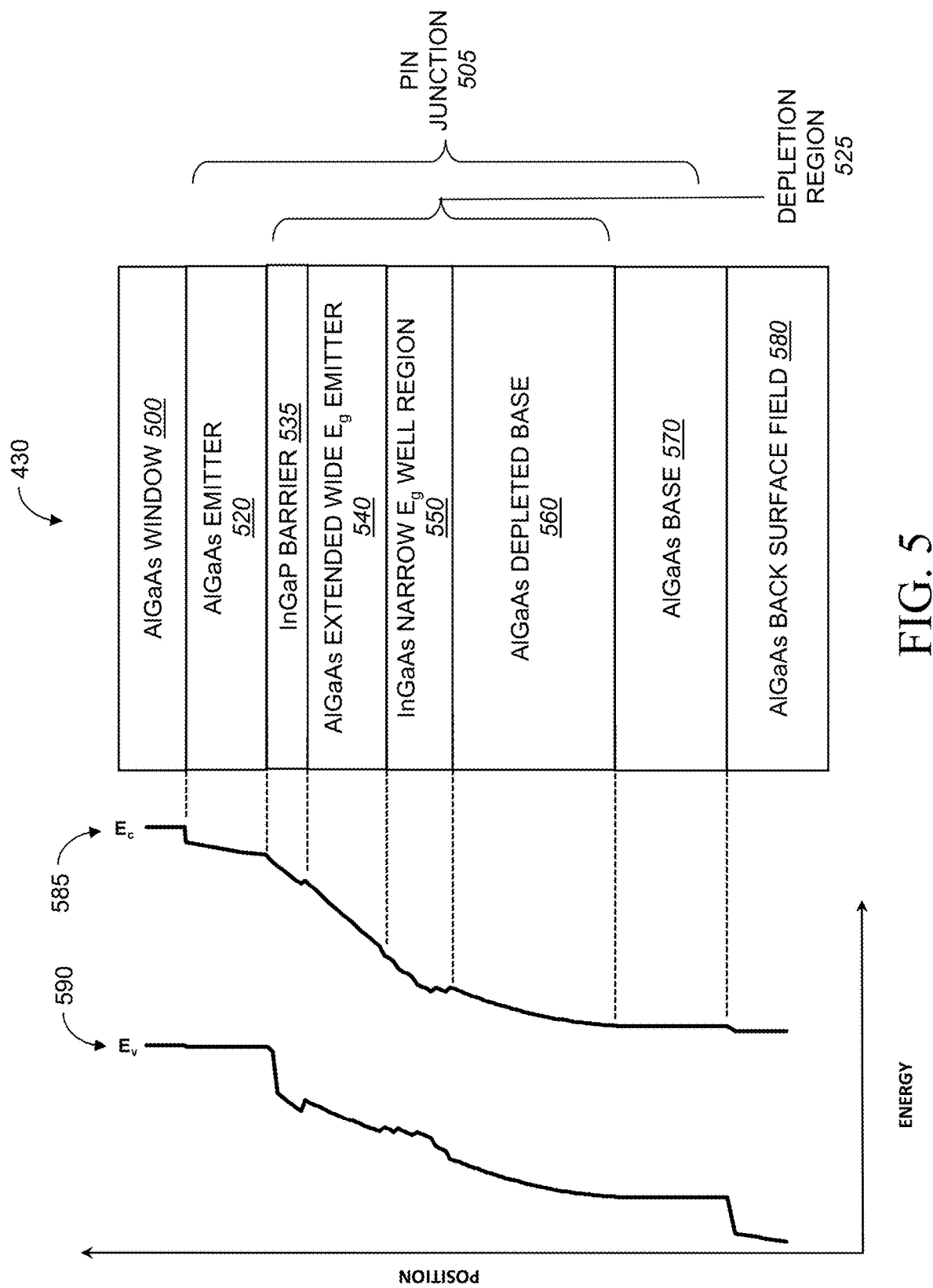
FIG. 5 is a diagram of the energy band versus position for a material structure of a thin film semiconductor solar cell, illustrating the desirable design elements to achieve a high operating voltage in a structure having both narrow and wide energy gap material, in accordance with illustrative embodiments.

The layer structures and associated energy bands graph depicted in FIG. 5, which is simplified to facilitate understanding, show the elements of a semiconductor thin film solar cell device structure 430 according to an illustrative embodiment. For explanatory purposes, the thin film solar cell device structure 430 comprises a high Al composition (Al %>50) window 500, an AlGaAs PIN junction 505, and an InGaP back surface field 580 according to an illustrative embodiment. As shown, the PIN junction 505 consists of a p-type AlGaAs emitter 520 with Al %>10; an n-type AlGaAs base 570 of lower Al composition than the emitter (such as Al %=0); and a depletion region 525 illustratively shown with a wide energy gap ($E_g$) InGaP barrier layer 535, an extended wide energy gap ($E_g$) AlGaAs emitter layer 240 with Al %>10, a narrow energy gap ($E_g$) InGaAs well region layer 550, and a depleted AlGaAs base layer region 560. The depletion region is distinguished by the presence of a built-in electric field, a non-zero slope in the conduction band 585 ($E_c$) and the valence band 590 ($E_v$), induced by the juxtaposition of p-type and n-type semiconductor material. In the illustrative embodiment, the depletion region is on the order of approximately 0.1 to 2 microns for thin film solar cells. It should be apparent to those skilled in the art that the thickness of the depletion region can be adjusted by varying the thickness of unintentionally doped material between the p-type and n-type material, and that a similar structure comprises an n-type InGaP emitter and p-type AlGaAs base, according to conventional techniques.

Figure 5A:
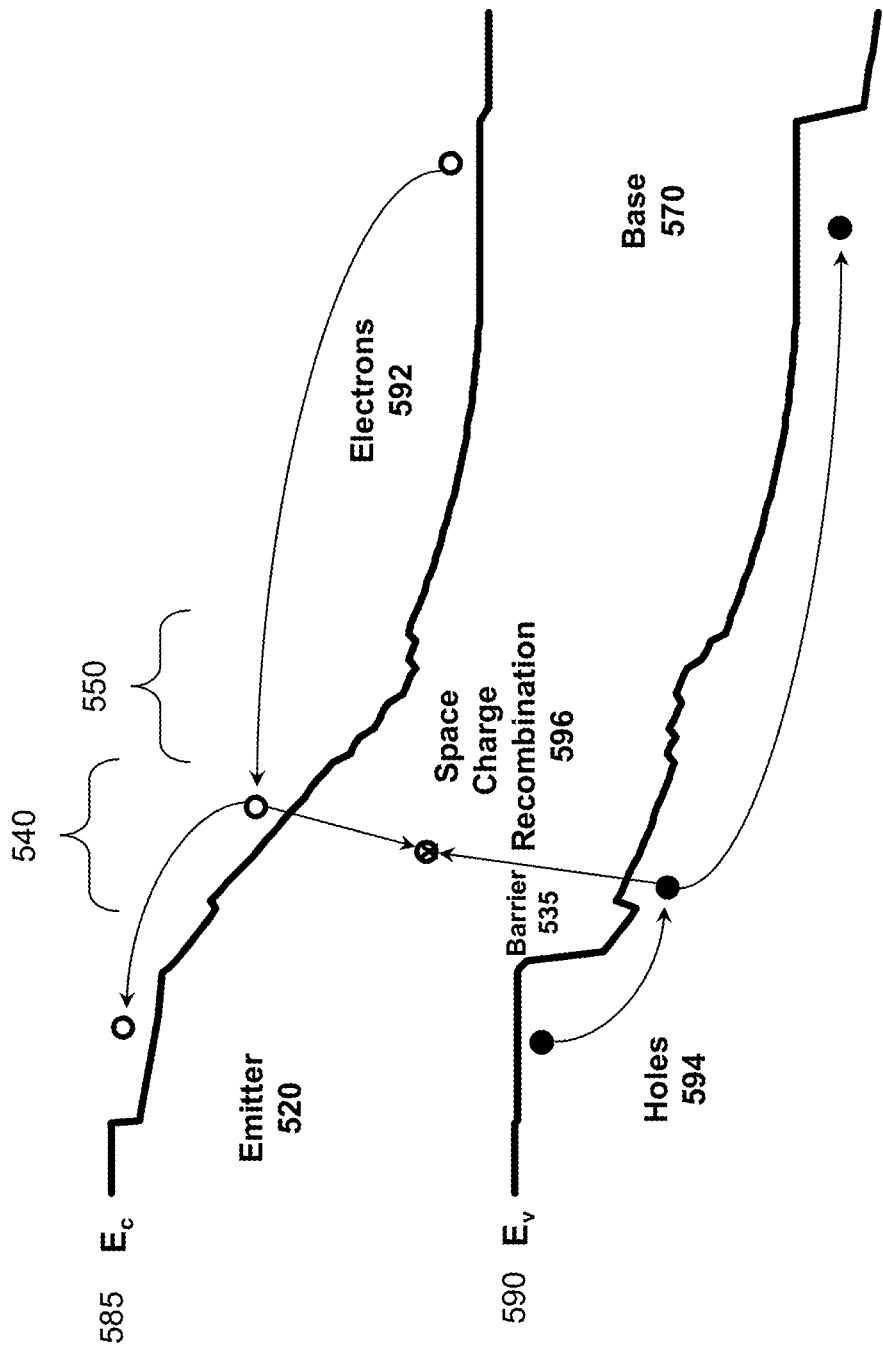
FIG. 5A is a diagram of the energy band versus position for a material structure of a thin film semiconductor solar cell, showing various dark diode current mechanisms, in accordance with illustrative embodiments.

The illustrative device structure shown in FIG. 5 provides several mechanisms by which to suppress the diode dark current, as illustrated in FIG. 5A, but without being bound to a particular theory. As with conventional heterojunction structures, the larger energy gap of emitter 520 relative to the base 570 reduces the diffusion of electrons 592 out of the n-type base layer. In addition, hole diffusion 594 is suppressed in this structure by placing a thin InGaP layer 535 adjacent to the p-type AlGaAs emitter 520. The large valence band offset ($\Delta F_v$) at the type II InGaP barrier/AlGaAs emitter (535/520) interface also alters the distribution of holes 594 within the depletion region. By reducing the hole concentration injected from the p-type AlGaAs emitter 520, the region of enhanced recombination within the depletion region can be pulled closer to the p-side of the structure, away from the InGaAs well region 550 and into the wide band gap material 540 in the depletion region adjacent to the emitter, thus reducing space charge recombination 596. The extended AlGaAs emitter/InGaP barrier (540/535) structure illustrated in FIG. 5 thus reduces both the non-radiative n=1 diffusion and n=2 space charge recombination components of the diode dark current.

Figure 5B:
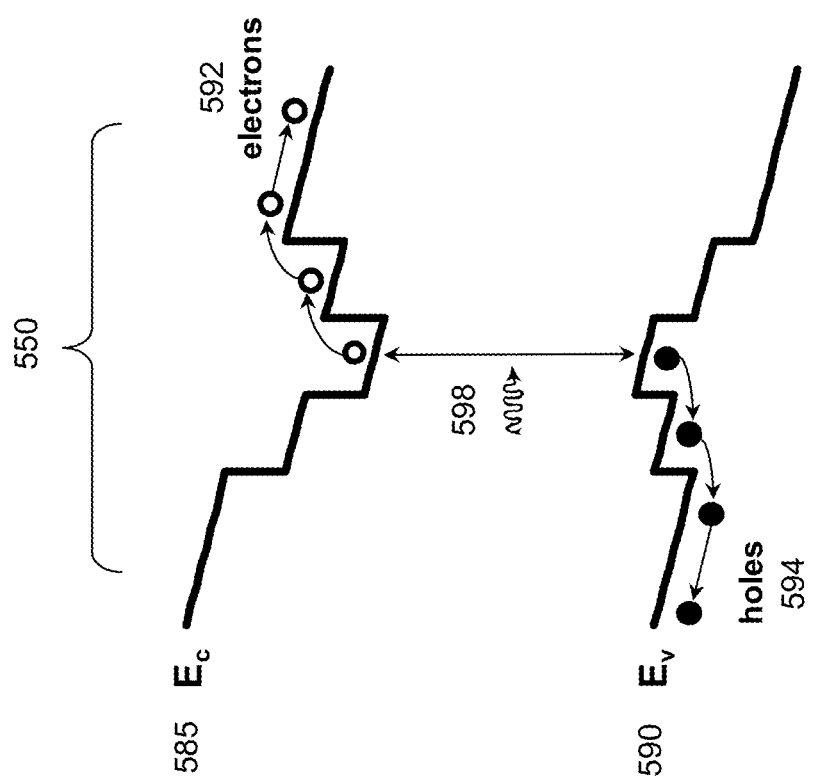
FIG. 5B is a diagram of the energy band versus position for part of the material structure of a thin film semiconductor solar cell, showing various carrier escape mechanisms, in accordance with illustrative embodiments.

While non-radiative recombination can be minimized by the use of the extended emitter heterojunction structure depicted in FIG. 5, radiative recombination within the InGaAs wells can still fundamentally limit the dark current, and hence the operating voltage, of the device. Previously, Yoshitaka Okada and co-workers at the University of Tsukuba have suggested the use of step graded InGaAs wells as a means of minimizing recombination losses in quantum well solar cells (see Y. Okada and N. Shiotsuka, "Fabrication of Potentially Modulated Multi-Quantum Well Solar Cells," Proceedings of the 31st IEEE Photovoltaic Specialists Conference, December 2005). Okada argues that radiative recombination rates inside the wells can be reduced due to spatial separation of electron and hole wavefunctions, which can result from placing the quantum wells within the built-in field of the depletion region of a P—N or P—I—N junction device. Higher escape rates, and further reductions in the wavefunction overlap, can be engineered by employing a step graded compositional profile to allow photogenerated carriers to readily hop out of the InGaAs well, as illustrated in FIG. 5B. In FIG. 5B, an incident photon 598 creates an electron 592—hole 594 pair that escapes from the InGaAs well region 550 through a series of field-assisted thermionic emission steps (see A. Alemu, J. A. H. Coaquira, and A. Freundlich, "Dependence of Device Performance on Carrier Escape Sequence in Multi-Quantum-Well p-i-n Solar Cells," J. Appl. Phys., vol. 99, no. 084506, May 2006). Similar escape mechanisms allow carriers being swept towards either the emitter or the base to avoid being capture in the InGaAs well region and potentially recombining radiatively and lowering the dark current.

According to the various embodiments shown and described herein, the CPV subassembly can be formed using conventional semiconductor and light emitting diode processing technology known to those of ordinary skill. The semiconductor thin films can be deposited via metal-organic chemical vapor deposition (MOCVD) or molecular beam epitaxy (MBE). Commercially available epitaxial lift-off (ELO) processes can be employed to remove the III-V epitaxial layers from their underlying substrate. The optical coatings and metal contacts can be applied using oblique-angle deposition, sputtering, or evaporation, among other techniques. Suitable optical coatings materials include but are not limited to indium tin oxide, titanium dioxide, silicon dioxide, and zinc oxide, and can be either dense films or porous, nanorod-structured films. Solar cell chips can be diced and separated using standard semiconductor equipment and procedures, and attached to lead frames via conductive paste and wire bonding. The PV cells and lead frames can be embedded in a refractive optical element comprised of silicone-based encapsulants, fabricated using molds and standard curing procedures. The refractive index of the silicone-based encapsulant can be increased to near n=2 by, among other methods, adding high refractive index nanoparticles such as $TiO_2$ (see Frank W. Mont, Jong Kyu Kim, Martin F. Schubert, E. Fred Schubert, and Richard W. Siegel, "High-Refractive-Index TiO2-Nanoparticle-Loaded Encapsulants for Light-Emitting Diodes," J. Appl. Phys., vol. 103, no. 083120, April 2008.) It should be apparent to those skilled in the art that various other techniques when made available can be employed to fabricate the structures of the described embodiment, herein.

The many features and advantages of the illustrative embodiments described herein are apparent from the above written description and thus it is intended by the appended claims to cover all such features and advantages of the invention. Further, because numerous modifications and changes will readily occur to those skilled in the art, it is not desired to limit the invention to the exact construction and operation as illustrated and described. For example, the illustrative embodiments can include additional layers to perform further functions or enhance existing, described functions. Likewise, while not shown, the electrical connectivity of the cell structure with other cells in an array and/or an external conduit is expressly contemplated and highly variable within ordinary skill. More generally, while some ranges of layer thickness and illustrative materials are described herein. It is expressly contemplated that additional layers, layers having differing thicknesses and/or material choices can be provided to achieve the functional advantages described herein. In addition, directional and locational terms such as "top", "bottom", "center", "front", "back", "above", and "below" should be taken as relative conventions only, and not as absolute. Furthermore, it is expressly contemplated that various semiconductor and thin films fabrication techniques can be employed to form the structures described herein. Accordingly, this description is to be taken only by way of example and not to otherwise limit the scope of the invention.

What is claimed is:

1. A method of manufacturing a concentrating photovoltaic cell subassembly comprising the steps of:
    bonding a lead structure to a III-V semiconductor solar cell structure, the solar cell structure comprising an InGaAs well having a step-graded compositional profile, the lead structure including electrical leads for the solar cell structure; and
    embedding the solar cell material structure and operatively connected lead structure within a transparent encapsulant by:
        placing the solar cell material structure into a mold filled with an encapsulant;
        curing the encapsulant so as to create an encapsulated solar cell device having a first hemispheric dome portion having an index of refraction of $n_{c2}$; and
        separating the encapsulated solar cell device from the mold; and
    placing the encapsulated solar cell device and associated lead structure into a second mold filled with lower refractive index encapsulant material to thereby perform an additional encapsulation having a second hemispheric dome portion concentric with the first hemispheric dome portion and having an index of refraction of $n_{c1}$ such that $n_{c1}$ is equal to a square root of $n_{c2}$, and the solar cell material structure is positioned at approximately 1.17*R below a top of the second hemispheric dome portion with R being a radius of the second hemispheric dome portion, and the first hemispheric dome portion has a radius of $R/n_{c1}$.

2. The method of claim 1 wherein the optical films are coated on the semiconductor solar cell material structure by oblique angle deposition.

3. The method of claim 1 wherein the transparent encapsulant material comprises $TiO_2$ nanoparticles dispersed within a silicone-based encapsulant.

4. The method of claim 1 further comprising the step of synthesizing the III-V semiconductor solar cell structure.

5. The method of claim 4 wherein the III-V device structure is separated from a starting substrate via an epitaxial liftoff process.

6. The method of claim 4 further comprising the step of dicing the semiconductor solar cell material structure into individual die prior to performing the bonding.

* * * * *